United States Patent
Deng et al.

(10) Patent No.: US 12,176,354 B2
(45) Date of Patent: Dec. 24, 2024

(54) DISPLAY SUBSTRATE AND DISPLAY PANEL

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Qi Deng, Beijing (CN); Yong Zhang, Beijing (CN); Zhichao Yang, Beijing (CN); Lingfang Nie, Beijing (CN); Yashuai An, Beijing (CN); Longhu Hao, Beijing (CN); Desheng Wang, Beijing (CN); Shuanghai Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/908,440

(22) PCT Filed: Aug. 31, 2021

(86) PCT No.: PCT/CN2021/115810
§ 371 (c)(1),
(2) Date: Aug. 31, 2022

(87) PCT Pub. No.: WO2023/028883
PCT Pub. Date: Mar. 9, 2023

(65) Prior Publication Data
US 2024/0194690 A1    Jun. 13, 2024

(51) Int. Cl.
*G02F 1/1362*   (2006.01)
*G02F 1/1368*   (2006.01)
*H01L 27/12*    (2006.01)

(52) U.S. Cl.
CPC ...... *H01L 27/124* (2013.01); *G02F 1/136286* (2013.01); *G02F 1/1368* (2013.01)

(58) Field of Classification Search
CPC ................. H01L 27/124; G02F 1/1368; G02F 1/134372; G02F 1/136286
See application file for complete search history.

(56) References Cited

U.S. PATENT DOCUMENTS

2015/0116622 A1    4/2015   Kim et al.
2017/0285386 A1*  10/2017   Ono ..................... G02F 1/13394
(Continued)

FOREIGN PATENT DOCUMENTS

CN    202837761 U    3/2013
CN    103472647 A    12/2013
(Continued)

OTHER PUBLICATIONS

Search Report dated Jul. 12, 2024 issued in corresponding European Application No. 21955437.5.
(Continued)

*Primary Examiner* — James A Dudek
(74) *Attorney, Agent, or Firm* — Nath, Goldberg & Meyer; Joshua B. Goldberg

(57) ABSTRACT

The disclosure provides display substrate and display panel, and belongs to field of display technology. The display substrate includes base substrate; and gate lines, data lines and sub-pixels on base substrate. Sub-pixels form first pixel groups arranged side by side along first direction and second pixel groups arranged side by side along second direction; first region is between any two adjacent first pixel groups, and second region is between any two adjacent second pixel groups; common electrode line is in at least a portion of the first regions, and common electrode line and data line are in different first regions; and common electrode line includes (Continued)

common electrode line segments and protrusions each coupled between two common electrode line segments, a width of protrusion in any direction is larger than that of common electrode line segment in first direction; and protrusion is in the second region.

20 Claims, 15 Drawing Sheets

(56) References Cited

U.S. PATENT DOCUMENTS

| | | | | |
|---|---|---|---|---|
| 2018/0292704 | A1* | 10/2018 | Hirosawa | G02F 1/133514 |
| 2019/0146254 | A1 | 5/2019 | Huang | |
| 2019/0196242 | A1* | 6/2019 | Nomura | G02F 1/1368 |
| 2020/0050065 | A1 | 2/2020 | Zang et al. | |
| 2020/0064667 | A1* | 2/2020 | Tominaga | G06F 3/0443 |

FOREIGN PATENT DOCUMENTS

| | | |
|---|---|---|
| CN | 103487994 A | 1/2014 |
| CN | 105572996 A | 5/2016 |
| CN | 105629611 A | 6/2016 |
| CN | 207380420 U | 5/2018 |
| CN | 108319086 A | 7/2018 |
| CN | 109307965 A | 2/2019 |
| CN | 109782500 A | 5/2019 |
| CN | 110488548 A | 11/2019 |
| CN | 110764329 A | 2/2020 |
| CN | 210155492 U | 3/2020 |
| CN | 111208680 A | 5/2020 |
| CN | 111458938 A | 7/2020 |
| CN | 211928360 U | 11/2020 |
| CN | 112540487 A | 3/2021 |
| KR | 20060086623 A | 8/2006 |
| KR | 20090044004 A | 5/2009 |
| KR | 20130047483 A | 5/2013 |
| KR | 20170126248 A | 11/2017 |
| WO | 2019076339 A1 | 4/2019 |

OTHER PUBLICATIONS

First Office Action dated Oct. 22, 2024 corresponding to Chinese application No. 202180002396.1.

* cited by examiner

DISPLAY SUBSTRATE AND DISPLAY PANEL

This is a National Phase Application filed under 35 U.S.C. 371 as a national stage of PCT/CN2021/115810, filed Aug. 31, 2021, the content of which is hereby incorporated by reference in its entirety.

TECHNICAL FIELD

The present disclosure belongs to the field of display technology, and particularly relates to a display substrate and a display panel.

BACKGROUND

A thin film transistor liquid crystal display (TFT-LCD for short) is an important flat panel display device. Along with the development of display technology, high resolution, high transmittance, large size, low power consumption and low cost have become the development direction of the future display field.

SUMMARY

The present disclosure aims to solve at least one of the technical problems existing in the prior art, and provides a display substrate and a display panel.

An embodiment of the present disclosure provides display substrate, including: a base substrate; and a plurality of gate lines, a plurality of data lines and a plurality of sub-pixels on the base substrate, wherein the plurality of sub-pixels form a plurality of first pixel groups arranged side by side along a first direction and a plurality of second pixel groups arranged side by side along a second direction; each of the plurality of first pixel groups includes sub-pixels arranged side by side in the second direction; each of the plurality of second pixel groups includes sub-pixels arranged side by side in the first direction; one gate line is provided on each of two sides of each second pixel group in the second direction; one of two adjacent sub-pixels in the second pixel group is coupled to a gate line located on one of two sides of the second pixel group in the second direction, and the other of the two adjacent sub-pixels is coupled to a gate line located on the other of the two sides of the second pixel group in the second direction; in every two adjacent first pixel groups, the sub-pixels are coupled to a same data line, and the sub-pixels coupled to the same data line are coupled to different gate lines, wherein any two adjacent first pixel groups define a first region therebetween, any two adjacent second pixel groups define a second region therebetween, and the display substrate further includes a common electrode line in at least a portion of the first regions, and the common electrode line and the data line are located in different first regions; and the common electrode line includes a plurality of common electrode line segments and protrusions each coupled between two common electrode line segments, a width of at least one of the protrusions in any direction is larger than a width of the common electrode line segment in the first direction; and the protrusions are located in the second region.

The sub-pixel includes a thin film transistor and a pixel electrode provided therein; a gate electrode of the thin film transistor is coupled to the gate line, a source electrode of the thin film transistor is coupled to the data line, and a drain electrode of the thin film transistor is coupled to the pixel electrode; and the pixel electrodes in a same second pixel group form a pixel electrode group, and the thin film transistors in any two adjacent sub-pixels in a same second pixel group are respectively located on two opposite sides of the pixel electrode group in the second direction.

One of any two thin film transistors coupled to a same data line and located in the sub-pixels in two adjacent first pixel groups is coupled to the data line at a first node, the other of the two thin film transistors is coupled to the data line at a second node, and the two thin film transistors are in central symmetry with a midpoint between the first node and the second node as a symmetry center.

The data line includes a plurality of data line segments, and a connection line segment connecting two adjacent data line segments; the connection line segment includes a first sub-connection line segment and a second sub-connection line segment, and the first sub-connection line segment is coupled to the data line segment via the second sub-connection line segment; the first sub-connection line segment is in the second region; the source electrode of the thin film transistor is coupled to the first sub-connection line segment; an included angle between an extending direction of the data line segment and the second direction is 5 to 10 degrees; and an included angle formed by the second sub-connection line segment and the data line segment is 100 to 130 degrees.

The display substrate further includes a common electrode in the pixel region; one of the pixel electrode and the common electrode is a slit electrode, and the other is a plate electrode; and an extending direction of slits of the slit electrode is the same as the extending direction of the data line segment.

An extending direction of the common electrode line segment is the same as the extending direction of the data line segment.

The display substrate includes a first metal layer on the base substrate; and the first metal layer includes the data line, the common electrode line, and the source electrode and the drain electrode of the thin film transistor.

The display substrate includes a second metal layer on the base substrate; and the second metal layer includes the gate line and the gate electrode of the thin film transistor.

The display substrate includes a second metal layer, a first interlayer insulating layer, a semiconductor layer, a first transparent conductive layer, a first metal layer, a second interlayer insulating layer, and a second transparent conductive layer arranged in sequence along a direction away from the base substrate; the first metal layer includes the data line, the common electrode line, and the source electrode and the drain electrode of the thin film transistor; the second metal layer includes the gate line and the gate electrode of the thin film transistor; the first transparent conductive layer includes the pixel electrode; and the second transparent conductive layer includes a common electrode.

The data line and the common electrode line are alternately arranged in the first direction.

An orthographic projection of the gate electrode of the thin film transistor on the base substrate covers an orthographic projection of a semiconductor active layer of the thin film transistor on the base substrate, the orthographic projection of the gate electrode on the base substrate includes a first side and a second side oppositely arranged along the first direction, and a third side and a fourth side oppositely arranged along the second direction; the orthographic projection of the semiconductor active layer on the base substrate includes a fifth side and a sixth side oppositely arranged along the first direction, and a seventh side and an eighth side oppositely arranged along the second direction, the fourth side is in contact with to an orthographic projection of the gate line on the base substrate; and the first side corresponds to the fifth side, and a distance between the first side and the fifth side is S1; the second side corresponds to the sixth side, and a distance between the second side and the sixth side is S2; the third side corresponds to the seventh side, and a distance between the third side and the seventh side is S3; and at least one of S1, S2, S3 is less than 3 μm.

A width of any one of the protrusions in any direction is greater than the width of the common electrode line segment in the first direction; and the protrusions are the same in size.

An embodiment of the present disclosure further provides a display panel, including the display substrate described above.

The display panel further includes a counter substrate opposite to the display substrate, and a spacer between the display substrate and the counter substrate; and an orthographic projection of the spacer on the base substrate is within an orthographic projection of the protrusion on the base substrate.

The spacer includes first spacers and second spacers; a height of the first spacer is greater than a height of the second spacer; and two ends of the first spacer are respectively abutted against the display substrate and the counter substrate.

Both the first spacers and the second spacers are uniformly arranged in the display panel, and a ratio of an arrangement density of the first spacers to an arrangement density of the second spacers is 1:30 to 1:70.

DETAIL DESCRIPTION OF EMBODIMENTS

In order to enable one of ordinary skill in the art to better understand the technical solutions of the embodiments of the present disclosure, the present disclosure is further described in detail with reference to the accompanying drawings and the specific embodiments below.

Unless defined otherwise, technical or scientific terms used herein shall have the ordinary meaning as understood by one of ordinary skill in the art to which the present disclosure belongs. The word "first", "second", or the like used in the present disclosure is not intended to indicate any order, quantity, or importance, but rather to distinguish one element from another. Also, the word "a", "an", "the", or the like do not denote a limitation of quantity, but rather denote the presence of at least one. The word "include", "comprise", or the like, means that the element or item preceding the word includes the element or item listed after the word and its equivalent, but does not exclude other elements or items. The terms "connected", "coupled" and the like are not limited to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

Figure 1:
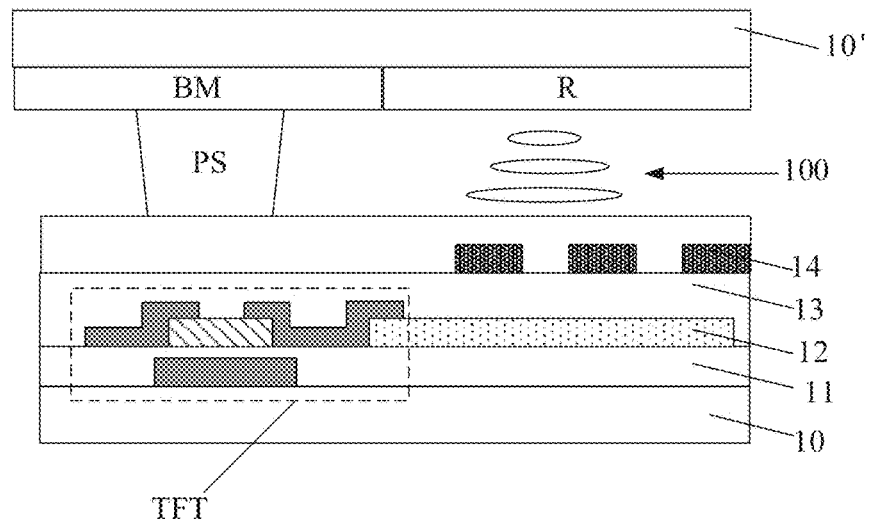
FIG. 1 is a cross-sectional view of an exemplary display panel.

FIG. 1 is a cross-sectional view of an exemplary display panel. As shown in FIG. 1, the display panel includes a display substrate and a counter substrate which are oppositely disposed, and a liquid crystal layer disposed between the display substrate and the counter substrate. The display substrate and the counter substrate are assembled to form a cell (i.e., form a liquid crystal cell) through a sealant disposed in a peripheral region Q2, and the liquid crystal cell is maintained through spacers PS disposed in a display region Q1. The display substrate may be an array substrate, and the counter substrate may be a color filter substrate. Of course, the display substrate may be a COA (color on array, i.e., the color filter layer is disposed on the array substrate) substrate, and in this case, the color filter layer is not disposed on the counter substrate. In the embodiments of the present disclosure, description is given by taking the case that the display substrate is an array substrate, and the counter substrate is a color filter substrate as an example. The array substrate includes a base substrate 10 and sub-pixels arranged on the base substrate 10, the sub-pixel includes a thin film transistor (TFT), a pixel electrode 12 and a common electrode 14, a first interlayer insulating layer 11 is arranged between a gate electrode and a semiconductor active layer of the TFT, and a second interlayer insulating layer 12 is arranged between a layer where a source electrode and a drain electrode of the TFT are located and a layer where the common electrode is located. The color filter substrate includes a substrate 10' and a color filter layer arranged on the substrate 10'. The color filter layer includes a color filter and a black matrix, the black matrix BM is configured to shield light and located to correspond to a non-light-transmissive element on the array substrate, such as the TFT, and the color filter is used for color display and located to correspond to the pixel electrode 12. FIG. 1 only illustrates a red filter R, and a green filter and a blue filter may be further included in the actual display panel, so as to implement color display of the display panel.

Figure 2:
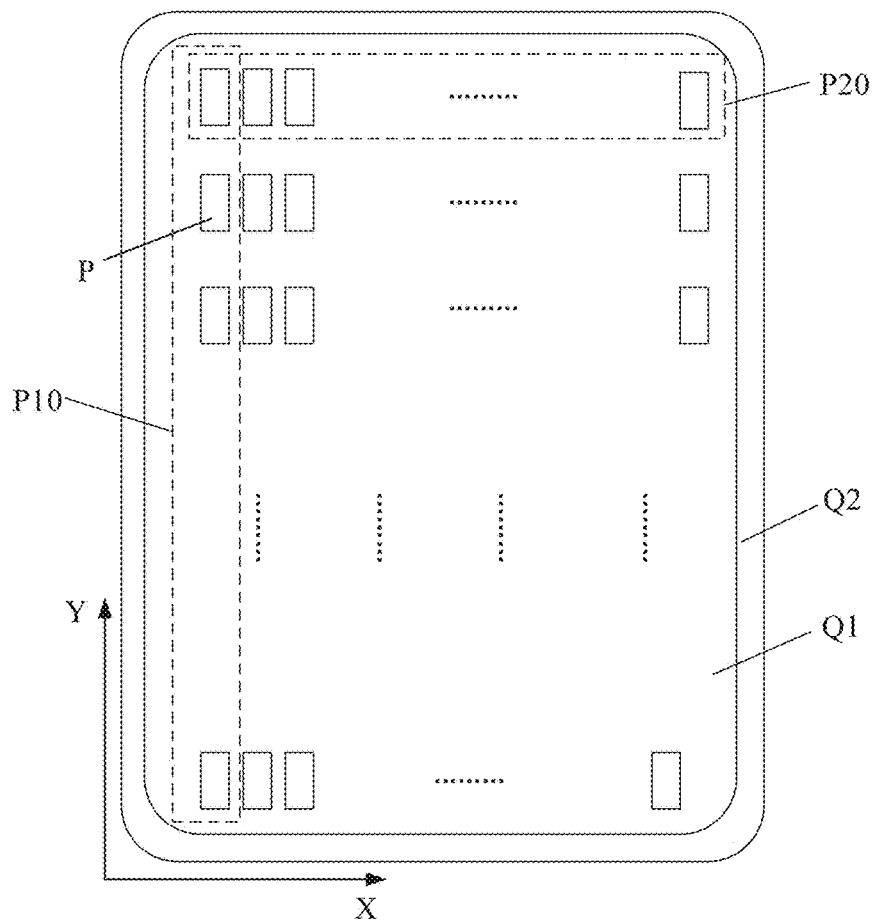
FIG. 2 is a top view of an array substrate in the display panel of FIG. 1.
Figure 3:
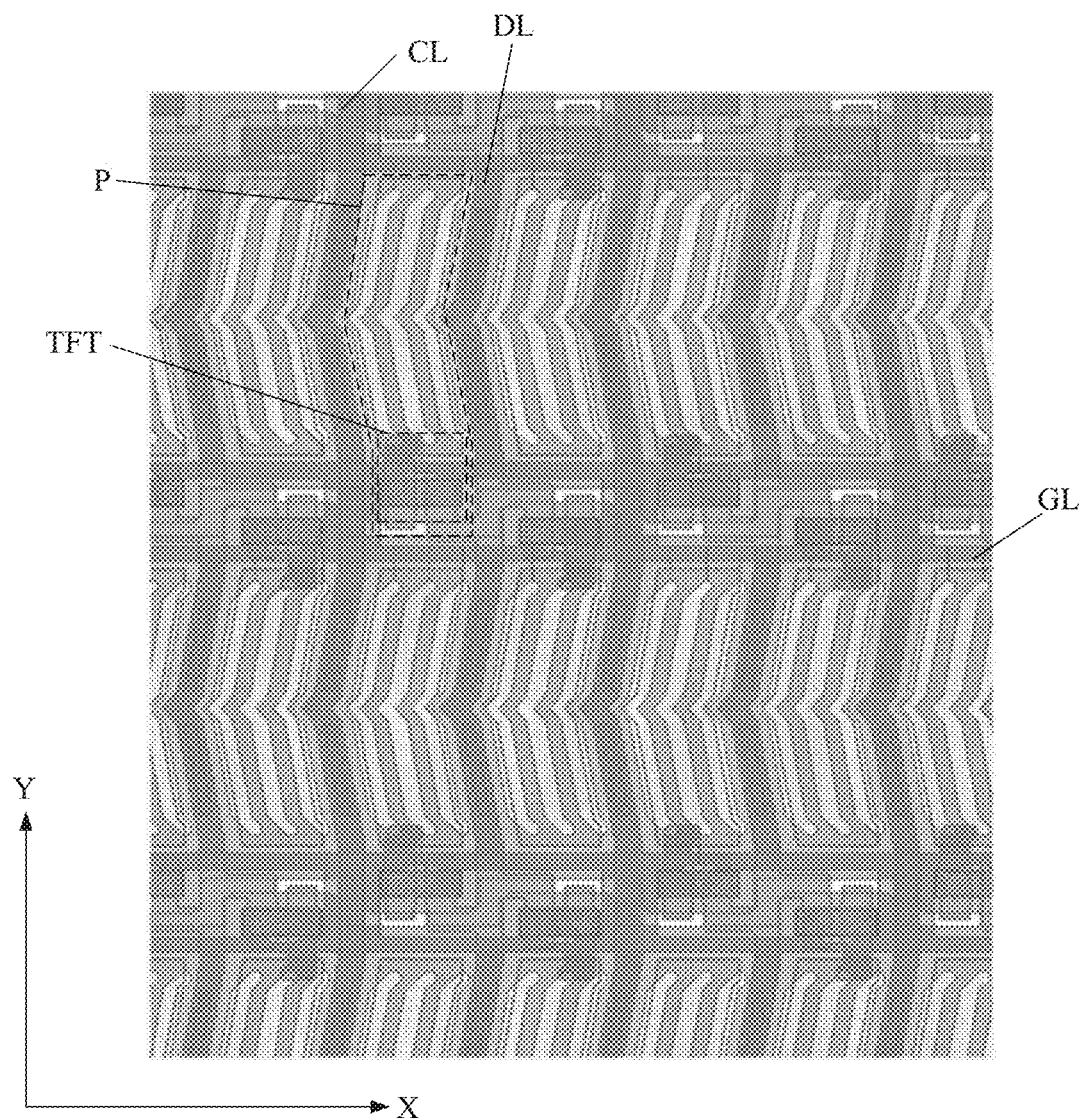
FIG. 3 is a layout of the array substrate shown in FIG. 2.

FIG. 2 is a top view of an array substrate in the display panel of FIG. 1; and FIG. 3 is a layout of the array substrate shown in FIG. 2. As shown in FIGS. 2 and 3, the array substrate is a dual-gate line array substrate, and may include a base substrate 10, and a plurality of sub-pixels P disposed on the base substrate 10; the sub-pixels P on the base substrate 10 form a plurality of first pixel groups P10 arranged side by side in a first direction X and a plurality of second pixel groups P20 arranged side by side in a second direction Y; each of the first pixel groups P10 includes sub-pixels P arranged side by side in the second direction Y; each of the second pixel groups P20 includes sub-pixels P arranged side by side in the first direction X. One gate line GL is disposed on each of two sides of each second pixel group P20 in the second direction Y. For two adjacent sub-pixels P in any second pixel group P20, one of the two adjacent sub-pixels P is coupled to a gate line GL located on one of two opposite sides of the sub-pixel P in the second direction Y, and the other of the two adjacent sub-pixels P is coupled to a gate line GL located on the other of the two opposite sides of the sub-pixel P in the second direction Y; and in every two adjacent first pixel groups P10, the sub-pixels P are coupled to the same data line DL, and the sub-pixels P coupled to the same data line DL are coupled to different gate lines GL.

Figure 4:
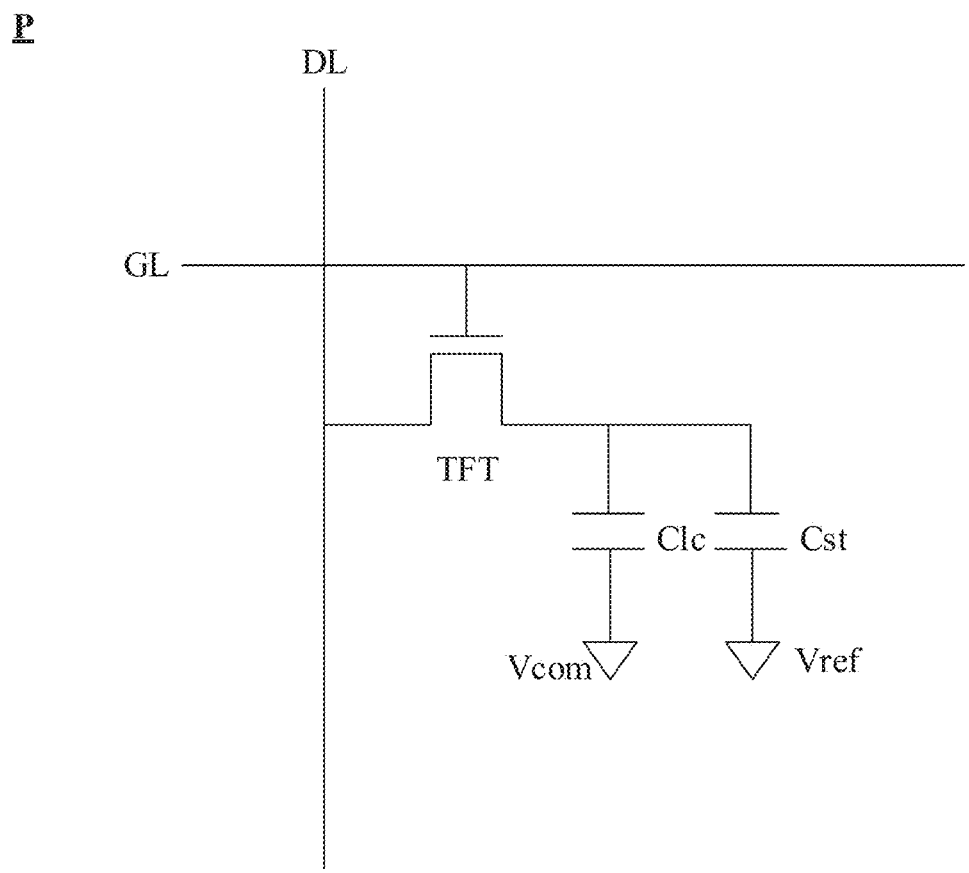
FIG. 4 is an equivalent circuit diagram of a sub-pixel in the array substrate of FIG. 2.

FIG. 4 is an equivalent circuit diagram of a sub-pixel in the array substrate of FIG. 2. As shown in FIG. 4, the equivalent circuit includes a thin film transistor TFT, a storage capacitor Cst, and a liquid crystal capacitor Clc; a first electrode of the thin film transistor TFT is coupled to the data line DL, a second electrode of the thin film transistor TFT is coupled to a first electrode plate of the storage capacitor Cst and a first electrode plate of the liquid crystal capacitor Clc, and a control electrode of the thin film transistor TFT is coupled to the gate line GL; a second electrode plate of the storage capacitor Cst is coupled to a reference voltage terminal Vref; a second electrode plate of the liquid crystal capacitor Clc is coupled to a common voltage signal. When the gate line GL is written with an operating level signal, the thin film transistor TFT is turned on, and the display of the corresponding gray scale is implemented by a voltage signal written into the data line DL.

In addition, the transistors employed in the embodiments of the present disclosure may be thin film transistors TFT, field effect transistors, or other switch devices having the same characteristics, and the thin film transistors TFT may include oxide semiconductor thin film transistors TFT, amorphous silicon thin film transistors TFT, polycrystalline silicon thin film transistors TFT, or the like. Each transistor includes a first electrode, a second electrode and a control electrode; the control electrode serves as a gate electrode of the transistor, one of the first electrode and the second electrode serves as a source electrode of the transistor, and the other one serves as a drain electrode of the transistor; the source electrode and the drain electrode of the transistor may be symmetrical in structure, so that they have no difference in physical structure. In the embodiments of the present disclosure, in order to distinguish transistors, except for a gate electrode serving as a control electrode, a first electrode is directly described as a source electrode, and a second electrode is directly described as a drain electrode, so that the source and drain electrodes of all or part of the transistors in the embodiments of the present disclosure may be interchanged as necessary.

FIG. 3 is a layout of the array substrate shown in FIG. 2. As shown in FIGS. 1 and 3, the array substrate includes a base substrate 10, and a second metal layer 20, a first interlayer insulating layer 11, a semiconductor layer 30, a first transparent conductive layer 40, a first metal layer 50, a second interlayer dielectric layer, and a second transparent conductive layer 60 sequentially disposed on the base substrate 10. The second metal layer 20 includes the gate line GL and the gate electrode of the thin film transistor TFT in each sub-pixel P, and the gate electrodes of the thin film transistors TFT in the sub-pixels P in the same second pixel group and the gate line GL coupled thereto are formed as a single piece. The semiconductor layer 30 includes a semiconductor active layer of the thin film transistor TFT in each sub-pixel P, and an orthographic projection of the semiconductor active layer in each thin film transistor TFT on the base substrate 10 and an orthographic projection of a gate electrode thereof on the base substrate 10 at least partially overlap. The first transparent electrode layer includes the pixel electrode 12 in each sub-pixel P. The second metal layer 20 includes data lines DL, common electrode lines CL, and the source and drain electrodes of the thin film transistors TFT in the sub-pixels P. The drain electrode of each thin film transistor TFT is bonded to the pixel electrode 12; the data line DL and the source electrode of each thin film transistor TFT coupled thereto are formed as a single piece. The second transparent electrode layer includes the common electrode 14 in each sub-pixel P. Since the common electrode 14 is located on a side of the pixel electrode 12 away from the base substrate 10, the common electrode 14 is a slit electrode (i.e., the common electrode includes slits).

With continued reference to FIG. 3, the thin film transistors TFT in the sub-pixels P located in two adjacent second pixel groups P20 and coupled to the same data line DL are located between two gate lines GL between the two adjacent second pixel groups P20. When the array substrate is applied to a display panel, the position of the spacer is just at the position corresponding to the thin film transistor TFT, and the end of the slit of the slit electrode has a corner. When the number of pixels per inch (PPI) is more than 300, i.e., the size of the sub-pixel P is less than or equal to 25.6 μm, according to the design of the pixel layout of FIG. 3, the aperture ratio will be reduced by more than 6% compared with the conventional display panel.

Figure 5:
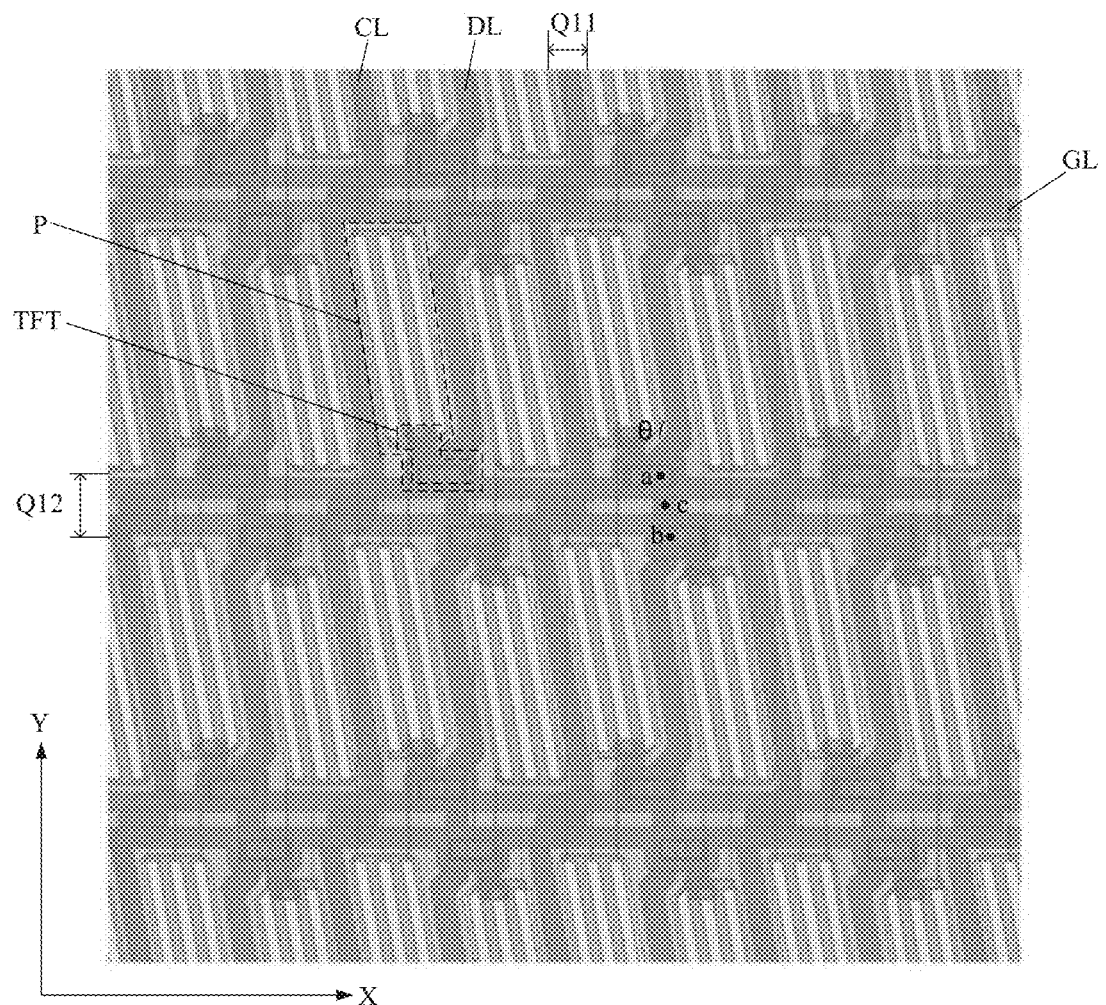
FIG. 5 is a layout of an array substrate according to an embodiment of the present disclosure.
Figure 6:
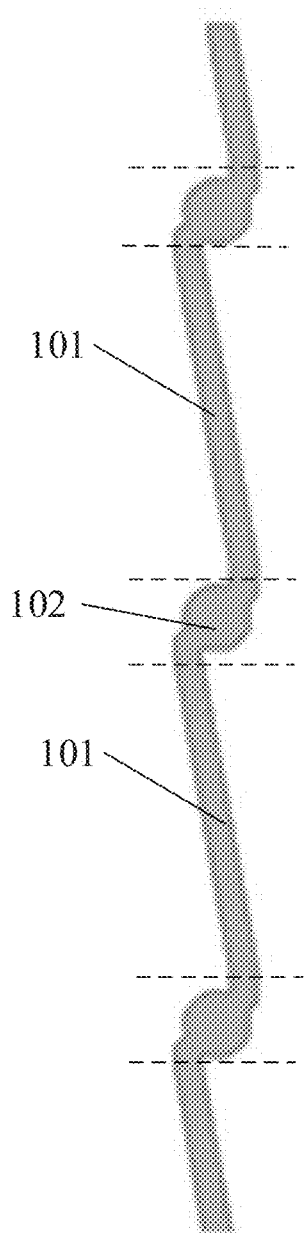
FIG. 6 is a schematic diagram of a common electrode line in an array substrate according to an embodiment of the present disclosure.

FIG. 5 is a layout of an array substrate according to an embodiment of the present disclosure; FIG. 6 is a schematic diagram of a common electrode line in an array substrate according to an embodiment of the present disclosure. As shown in FIGS. 5 and 6, the array substrate provided in this embodiment of the present disclosure is similar to the array substrate shown in FIG. 1, and is a dual-gate line array substrate, which may specifically include a base substrate 10, and a plurality of sub-pixels P, a plurality of gate lines GL and a plurality of data lines DL disposed on the base substrate 10. Arrangement of the sub-pixels P is as shown in FIG. 2, the plurality of sub-pixels P form a plurality of first pixel groups P10 arranged side by side in the first direction X, and a plurality of second pixel groups P20 arranged side by side in the second direction Y. Each first pixel group P10 includes sub-pixels P arranged side by side along the second direction Y; and each second pixel group P20 includes sub-pixels P arranged side by side in the first direction X. One gate lines GL is provided on each of both sides of each second pixel group P20 in the second direction Y, and in this case, two gate lines GL are provided between any two adjacent second pixel groups P20. For two adjacent sub-pixels P in any second pixel group P20, one of the two adjacent sub-pixels is couple to a gate line GL located at one of two opposite sides of the sub-pixel P in the second direction Y, and the other sub-pixel is couple to a gate line GL located at the other of the two opposite sides of the sub-pixel P in the second direction Y; in every two adjacent first pixel groups P10, the sub-pixels P are coupled to the same data line DL, and the sub-pixels P coupled to the same data line DL are coupled to different gate lines GL. A first region Q11 is defined between any two adjacent first pixel groups P10, and a second region Q12 is defined between any two adjacent second pixel groups P20; a common electrode line CL is further provided in at least a portion of the first regions Q11, and the common electrode line CL and the data line DL are located in different first regions Q11. That is, if the data line DL is disposed between two adjacent first pixel groups P10, the common electrode line CL is not disposed between the two adjacent first pixel groups P10. In an embodiment of the present disclosure, the common electrode line CL includes a plurality of common electrode line segments 101, and protrusions 102 each coupled between two common electrode line segments 101, and a width of at least one protrusion 102 in any direction is greater than a width of the common electrode line segment 101 in the first direction X; the protrusion 102 is located in the second region Q12.

Figure 7:
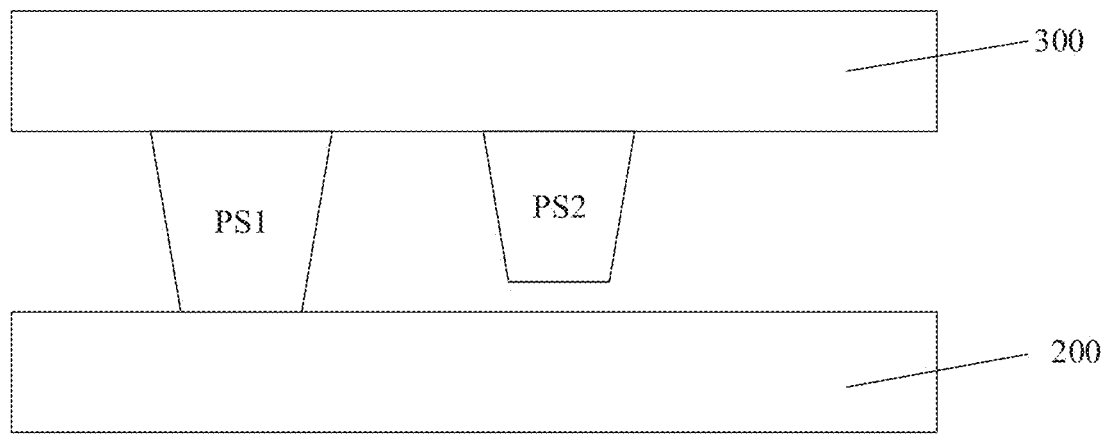
FIG. 7 is a schematic diagram of a display panel having an array substrate according to an embodiment of the present disclosure is applied.

It should be noted that, FIG. 7 is a schematic diagram of a display panel to which an array substrate according to an embodiment of the disclosure is applied. As shown in FIG. 7, the display panel includes an array substrate 200 and a color filter substrate 300 that are disposed opposite to each other, and a spacer disposed therebetween. The array substrate 200 is an array substrate in the embodiment of the disclosure, and FIG. 7 is an exemplary diagram and does not illustrate the specific structure of each film layer. When the array substrate in the embodiment of the present disclosure is applied to a display panel, the spacer PS for maintaining the cell thickness of the display panel is disposed correspondingly in position to the protrusion having a width in any direction greater than that of the common electrode line segment 101 in the first direction X, that is, an orthographic projection of one spacer on the base substrate 10 is located within an orthographic projection of one corresponding protrusion 102 on the base substrate 10. Generally, the spacer PS in the display panel includes a first spacer PS1 and a second spacer PS2, the first spacer PS1 has a larger height than the second spacer PS2, and the orthographic projection of the first spacer PS1 on the base substrate 10 has an area larger than that of the orthographic projection of the second spacer PS2 on the base substrate 10. In this case, the first spacer PS1 serves as a main spacer to maintain the cell thickness of the display panel; and the second spacer PS2 serves as an auxiliary spacer to act as a buffer when the external force is applied on the display panel. In the embodiment of the present disclosure, the protrusions 102 are formed on the common electrode lines CL, and the spacers are disposed at positions corresponding to the protrusions 102, so that a problem that an aperture ratio of each sub-pixel P is not uniform due to different sizes of the spacers can be effectively avoided.

In some examples, with continued reference to FIG. 6, the protrusion 102 may have any shape, such as a polygon, a circle, an ellipse, etc., and the shape of the protrusion 102 is not limited in the embodiments of the present disclosure. FIG. 6 illustrates only the circular protrusion 102 as an example.

In some examples, the width in any direction of each of the protrusions 102 on any common electrode line CL is greater than the width of the common electrode line segment 101 in the first direction X. Further, the sizes of all the protrusions 102 are the same, and in this case, when the common electrode line CL is made of a non-light-transmissive material, that is, the protrusions 102 are non-transmissive regions, the aperture ratio of the display substrate can be ensured to be uniform, and thus, the display uniformity can be improved. The embodiment of the present disclosure has been described by taking the example that the sizes of the protrusions 102 are the same, but this does not limit the scope of the embodiments of the present disclosure.

In some examples, with continued reference to FIG. 5, the thin film transistor TFT and the pixel electrode 12 are disposed in each sub-pixel P, the gate electrode of the thin film transistor TFT is coupled to the gate line GL, the source electrode of the thin film transistor TFT is coupled to the data line DL, and the drain electrode of the thin film transistor TFT is coupled to the pixel electrode 12. The pixel electrodes 12 in the same second pixel group P20 form a pixel electrode group, and the thin film transistors TFT in any two adjacent sub-pixels P in the same second pixel group P20 are respectively located at two opposite sides of the pixel electrode group in the second direction Y. For example, as shown in FIG. 5, one of the thin film transistors TFT in any two adjacent sub-pixels P in the same second pixel group P20 is located above the pixel electrode group, and the other of the thin film transistors TFT is located below the pixel electrode group. As can be seen from FIG. 5, the thin film transistor TFT in each sub-pixel P is located on a side of the gate line GL close to the pixel electrode 12, so that compared with the array substrate shown in FIG. 2, the distance between two thin film transistors TFT located in the adjacent second pixel groups P20 and coupled to the same data line DL is increased, and therefore, the risk of short circuit between the source electrode and the drain electrode of the two thin film transistors TFTs can be effectively reduced.

Of course, not only the pixel electrode 12 but also the common electrode 14 may be provided in each sub-pixel P. When the pixel electrode 12 is disposed closer to the base substrate 10 than the common electrode 14, the pixel electrode 12 is a plate electrode, and the common electrode 14 is a slit electrode; when the common electrode 14 is disposed closer to the base substrate 10 than the pixel electrode 12, the common electrode 14 is a plate electrode, and the pixel electrode 12 is a slit electrode. In the following description of the embodiments of the present disclosure, by way of example, the pixel electrode 12 is a plate electrode and the common electrode 14 is a slit electrode, which does not limit the scope of the embodiments of the present disclosure. Further, the extending direction of the slits in each common electrode 14 is a single direction, that is, there is no corner at both ends of each slit, so as to ensure that the aperture ratio of each sub-pixel P is uniform. For example, the extending direction of the slits is substantially the same as, or even completely coincides with, the extending direction of the common electrode line segments 101. Here, the fact that the extending direction of the slits is substantially the same as the extending direction of the common electrode line segments 101 means that the included angle between the extending directions of the slits and the common electrode line segments and the first direction X is within 5 degrees. Of course, the slits may not be linear openings, and may be polyline openings. The orientation of the opening of the slit is not limited in the embodiments of the present disclosure.

In some examples, with continued reference to FIG. 5, in the array substrate, the thin film transistors TFT coupled to the same data line DL and located in sub-pixels P of two adjacent the first pixel groups P10 are in central symmetry.

That is to say, for any two thin film transistors TFT coupled to the same data line and located in the sub-pixels P of the two adjacent first pixel groups P10, the connection node between one of the two thin film transistors TFT and the data line DL is the first node a, the connection node between the other of the two thin film transistors TFT and the data line DL is the second node b, and the two thin film transistors TFT are in central symmetry with the midpoint c between the first node a and the second node b as a symmetry center. For example, two thin film transistors coupled to the same data line DL and located at diagonal positions are in central symmetry. Of course, in the sub-pixels P coupled to the same data line DL and located in the two adjacent first pixel groups P10, not only the thin film transistors TFT, but also the pixel electrodes 12 and the common electrodes 14 are in central symmetry respectively. The arrangement ensures the uniformity of the aperture ratio of each sub-pixel P.

Figure 8:
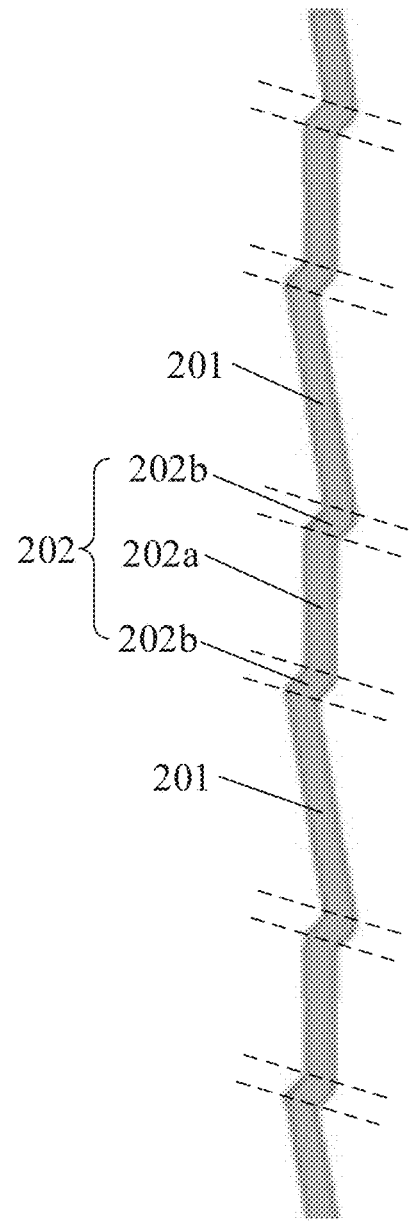
FIG. 8 is a schematic diagram of a data line in an array substrate according to an embodiment of the present disclosure.

In some examples, FIG. 8 is a schematic diagram of a data line in an array substrate according to an embodiment of the present disclosure. As shown in FIG. 8, any data line DL includes a plurality of data line segments 201, and connection line segments 202 each connecting two adjacent data line segments 201, the connection line segment 202 includes a first sub-connection line segment 202a and two second sub-connection line segments 202b, each of two ends of the first sub-connection line segment 202a is coupled to one second sub-connection line segment 202b, and is coupled to the data line segment 201 via the second sub-connection line segment 202b. The data line segment 201 is located in the first region Q11, the first sub-connection line segment 202a is located in the second region Q12, and the second sub-connection line segment 202b may be located in the first region Q11, or may be located in the second region Q12, or may be partially located in the first region Q11 and partially located in the second region Q12. The extension lines of the odd-numbered data line segments 201 coincide, the extension lines of the even-numbered data line segments 201 coincide, and the extension lines of the odd-numbered data line segments 201 and the even-numbered data line segments 201 are parallel. The source electrode of the thin film transistor TFT in each sub-pixel P is coupled to the first sub-connection line segment 202a, and the included angle between the extending direction of the data line segment 201 and the second direction Y is about 5 to 10 degrees. The included angle ⊖ formed by the second sub-connection line segment 202b and the data line segment 201 coupled thereto is about 100 degrees to 130 degrees. For example, when the extending direction of the data line segment 201 and the second direction Y forms an included angle of 10 degrees, the angle ⊖ formed by the second sub-connection line segment 202b and the data line segment 201 coupled thereto is 125 degrees. For another example, when the extending direction of the data line segment 201 and the second direction Y forms an included angle of 5 degrees, the included angle ⊖ formed by the second sub-connection line segment 202b and the data line segment 201 coupled thereto is 130 degrees. For another example, when the extending direction of the data line segment 201 and the second direction Y forms an included angle of 7 degrees, the included angle ⊖ formed by the second sub-connection line segment 202b and the data line segment 201 connected thereto is 132 degrees. That is, there is a corner at the position of the data line DL where the thin film transistor TFT is coupled to the data line DL, and in this way, the aperture of each sub-pixel P is increased. In the embodiment of the present disclosure, preferably, the extending direction of the data line segment 201 and the second direction Y forms an included angle of 10 degrees, and the included angle ⊖ formed by the second sub-connection line segment 202b and the data line segment 201 coupled thereto is 125 degrees. Through experimental verification, in the case where the included angle formed by the extending direction of the data line segment 201 and the second direction Y is 10 degrees, and the included angle ⊖ formed by the second sub-connection line segment 202b and the data line segment 201 coupled thereto is 125 degrees, the aperture ratio of pixel can be improved by 2.29/6, compared with the case where the included angle formed by the extending direction of the data line segment 201 and the second direction Y is 5 degrees, and the included angle ⊖ formed by the second sub-connection line segment 202b and the data line segment 201 coupled thereto is 130 degrees; and the aperture ratio of pixel can be improved by 1.76% compared with the case where the included angle formed by the extending direction of the data line segment 201 and the second direction Y is 7 degrees, and the included angle ⊖ formed by the second sub-connection line segment 202b and the data line segment 201 coupled thereto is 130 degrees.

Further, the data lines DL and the common electrode lines CL are alternately arranged, and the extending directions of the data line segments 201 and the common electrode line segments 101 are the same. That is, one of two adjacent first regions Q11 is provided with the data line DL, and the other is provided with the common electrode line CL. In this way, the sub-pixels P in the array substrate can be arranged regularly, so that the transmittance of the sub-pixels P can be uniform.

In some examples, the array substrate in the embodiments of the present disclosure may include a first metal layer 50, and the first metal layer 50 includes the common electrode line CL and the data line DL, and the source electrode and the drain electrode of the thin film transistor TFT. That is, in the array substrate, the common electrode line CL, the data line DL, and the source and drain electrodes of the thin film transistor TFT are disposed in the same layer and made of the same material. In this case, the pattern including the common electrode line CL, the data line DL, and the source and drain electrodes of the thin film transistor TFT may be formed through a single patterning process. Since the source electrode of each thin film transistor TFT needs to be coupled to the data line DL, the source electrode of the thin film transistor TFT and the data line DL coupled thereto may be formed as a single piece.

In some examples, the array substrate in the embodiments of the present disclosure may include a second metal layer 20, and the second metal layer 20 includes the gate line GL and the gate electrode of each thin film transistor TFT. In this case, a pattern including the gate line GL and the gate electrode of each thin film transistor TFT may be formed through a single patterning process. Since the gate electrode of each thin film transistor TFT needs to be coupled to the gate line GL, the gate electrode of the thin film transistor TFT and the gate line GL coupled thereto may be formed as a single piece.

In order to make the structure of the array substrate in the embodiments of the present disclosure clearer, the array substrate in the embodiments of the present disclosure is described in detail below with reference to FIG. 5 and the layout of each film layer of the array substrate shown in FIG. 5.

As shown in FIG. 5, the array substrate includes: a base substrate 10, and a plurality of sub-pixels P, a plurality of gate lines GL and a plurality of data lines DL disposed on the base substrate 10. A thin film transistor TFT, a pixel electrode 12 and a common electrode 14 are provided in each sub-pixel P. From the viewpoint of film layers, the array substrate includes a base substrate 10, and a second metal layer 20, a first interlayer insulating layer 11, a semiconductor layer 30, a first transparent conductive layer 40, a first metal layer 50, a second interlayer insulating layer 13, and a second transparent conductive layer 60 sequentially disposed on the base substrate 10. Next, the structure of each film layer will be explained.

Figure 9:
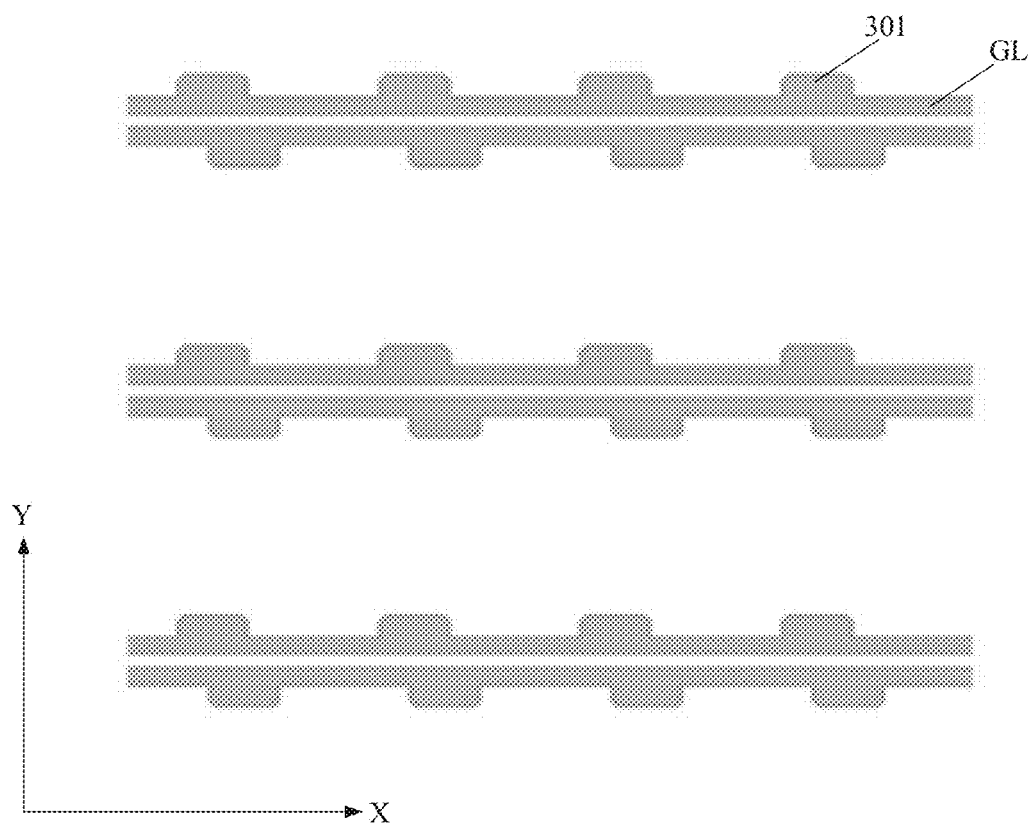
FIG. 9 is a layout of a second metal layer in an array substrate according to an embodiment of the present disclosure.

FIG. 9 is a layout of a second metal layer in the array substrate according to an embodiment of the disclosure. As shown in FIG. 9, the second metal layer 20 includes a gate line GL and a gate electrode 301 of the thin film transistor TFT in each sub-pixel P, and the gate line GL and the gate electrode 301 of the thin film transistor TFT coupled thereto are formed as a single piece. In some examples, the material of the second metal layer 20 includes, but is not limited to, conductive materials such as molybdenum (Mo), molybdenum niobium alloy, aluminum (Al), aluminum neodymium alloy, titanium (Ti), or copper (Gu), and the second metal layer 20 may have a single-layer structure or a multi-layer structure, such as a Ti/Al/Ti triple-layer structure.

In some examples, the first interlayer insulating layer 11, which serves as a gate insulating layer, is disposed between the gate electrode of each thin film transistor TFT and the semiconductor active layer. The material of the first interlayer insulating layer 11 may be selected to have a lattice structure similar to that of Si, such as silicon nitride ($Si_xN_y$) or silicon oxide ($Si_xO_y$). Specifically, the first interlayer insulating layer 11 may have a single-layer structure made of silicon nitride or silicon oxide, or may have a composite film structure made of silicon nitride and silicon oxide.

Figure 10:
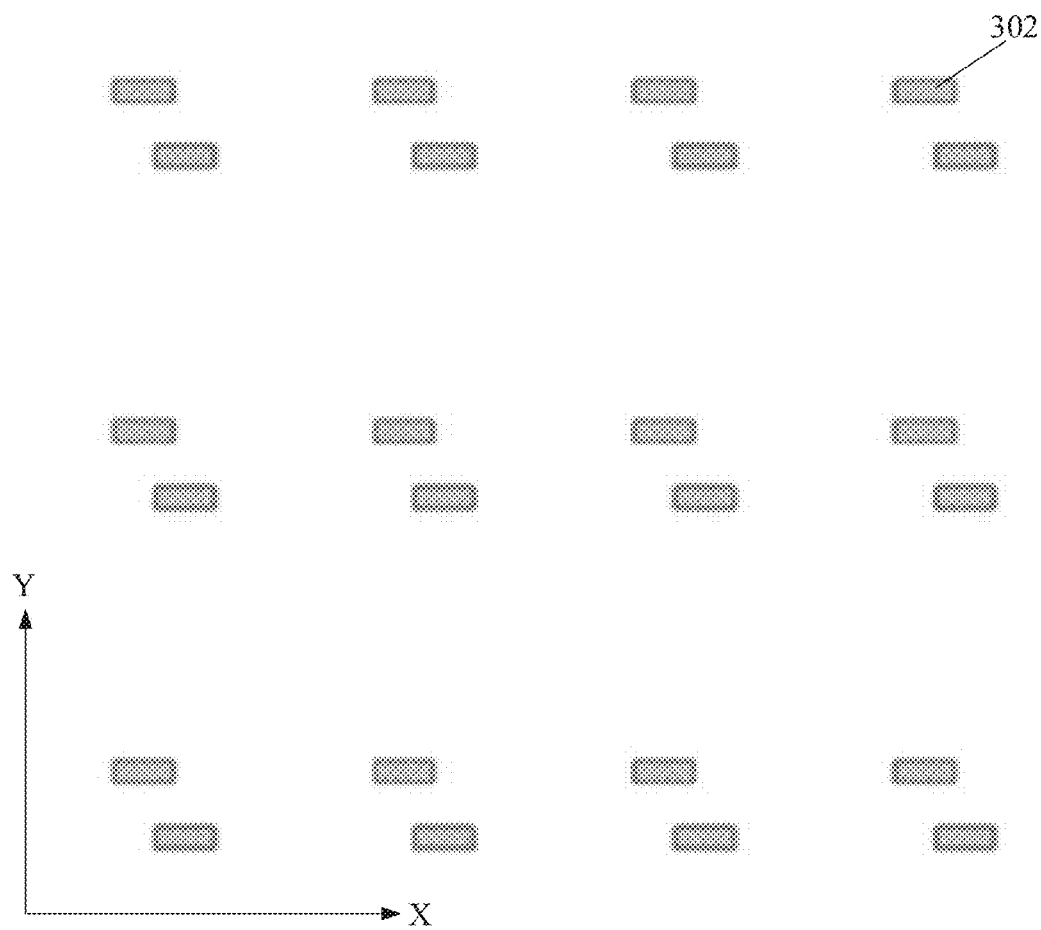
FIG. 10 is a layout of a semiconductor layer in an array substrate according to an embodiment of the present disclosure.
Figure 11:
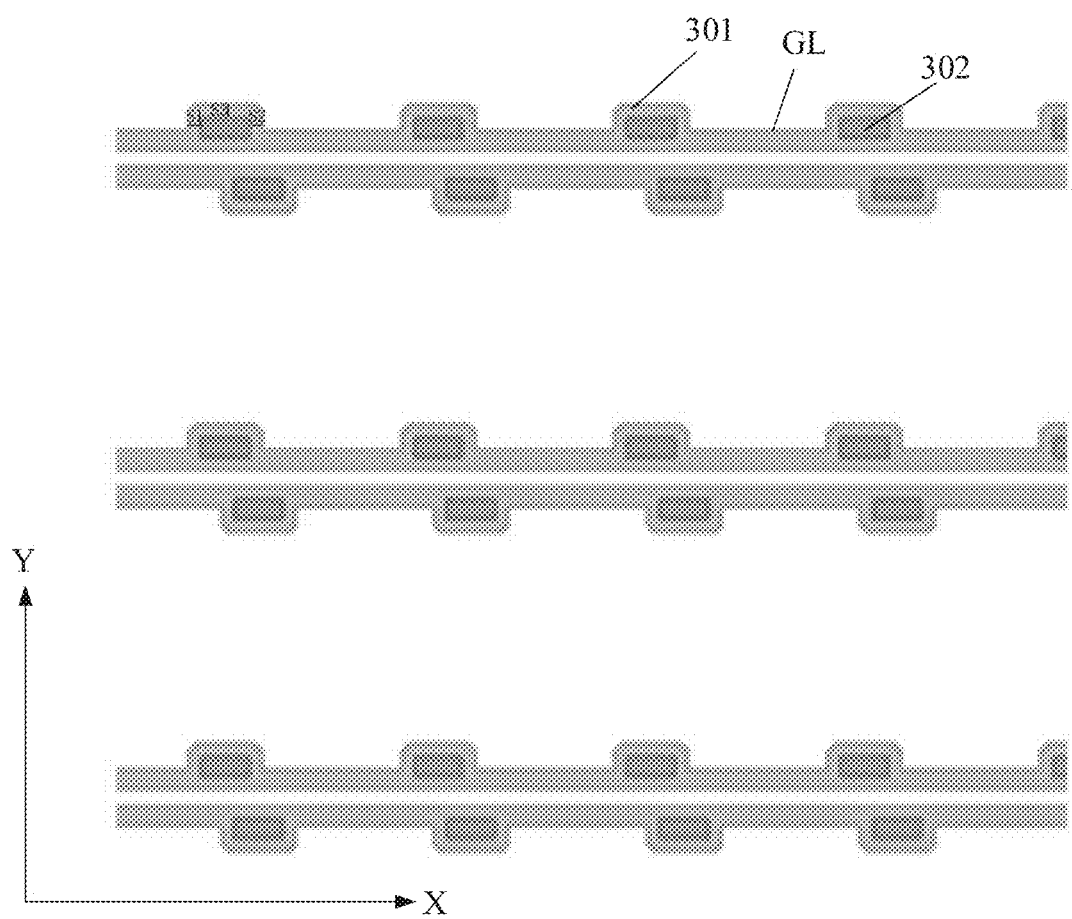
FIG. 11 is a layout of a semiconductor layer formed on a base substrate on which a first insulating layer is formed.

FIG. 10 is a layout of a semiconductor layer in an array substrate according to an embodiment of the present disclosure. As shown in FIG. 10, the semiconductor layer 30 includes a semiconductor active layer 302 of the thin film transistor TFT in each sub-pixel P. The semiconductor active layer 302 includes an active layer pattern (channel region) and a doped region pattern (source-drain doped region) of the thin film transistor TFT of each sub-pixel P. For example, the semiconductor layer 30 may be made of amorphous silicon, polycrystalline silicon, an oxide semiconductor material, or the like. The source region and the drain region may be regions doped with n-type impurities or p-type impurities. Of course, the material of the semiconductor layer 30 may also include an oxide semiconductor, and may be, for example, Indium Gallium Zinc Oxide (IGZO), Indium Zinc Oxide (IZO), Zinc Oxide (ZnO), Gallium Zinc Oxide (GZO), or the like. In the embodiment of the present disclosure, description is given by taking the case that the material of the semiconductor layer 30 is low temperature polysilicon as an example. FIG. 11 is a layout of a semiconductor layer formed on a base substrate plate on which a first insulating layer is formed. As shown in FIG. 11, orthographic projections of one semiconductor active layer and one gate electrode on the base substrate 10 overlap. In the embodiment of the present disclosure, the orthographic projection of the gate electrode of the thin film transistor on the base substrate covers the orthographic projection of the active layer on the base substrate. The orthographic projection of the gate electrode on the base substrate includes a first side (left) and a second side (right) which are oppositely arranged along the first direction, and a third side (upper) and a fourth side (lower) which are oppositely arranged along the second direction; the orthographic projection of the semiconductor active layer on the base substrate includes a fifth side (left) and a sixth side (right) which are oppositely arranged along the first direction, and a seventh side (upper) and an eighth side (lower) which are oppositely arranged along the second direction; the fourth side (lower) of the gate electrode is in contact with the orthographic projection of the gate line on the base substrate (namely, the gate electrode of the thin film transistor and the gate line coupled thereto are formed as a single piece); the first side of the gate electrode corresponds to the fifth side of the semiconductor active layer, and the distance between the first side and the fifth side is S1; the second side of the gate electrode corresponds to the sixth side of the semiconductor active layer, and the distance between the second side and the sixth side is S2; the third side of the gate electrode corresponds to the seventh side of the semiconductor active layer, and the distance between the third side and the seventh side is S3; at least one of S1, S2, and S3 is less than 3 μm. In some examples, S1=S2=S3=2.75 μm. It should be understood that the values of S1, S2, S3 may be specifically set according to the size of the display panel and the requirements on aperture ratio of pixel. In the embodiment of the present disclosure, at least one of S1, S2, and S3 being smaller than 3 μm facilitates the display panel to realize high PPI design and increased aperture ratio of pixel, and the aperture ratio of pixel can be increased by more than 6.5% when S1=S2=S3=2.75 μm.

Figure 12:
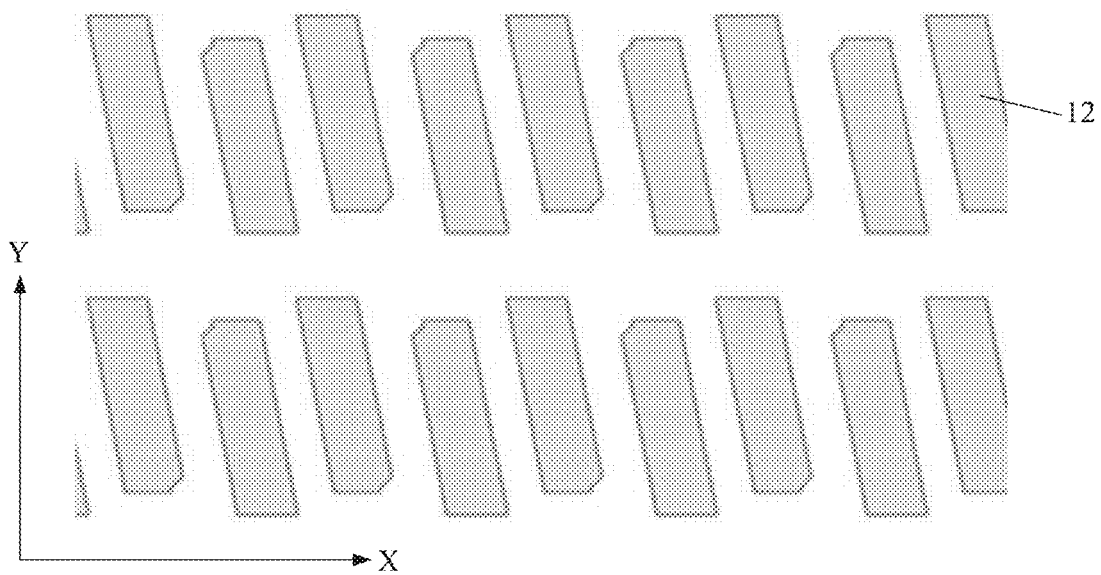
FIG. 12 is a layout of a first transparent conductive layer in an array substrate according to an embodiment of the present disclosure.

FIG. 12 is a layout of a first transparent conductive layer in the array substrate according to the embodiment of the disclosure. As shown in FIG. 12, the first transparent conductive layer 40 includes the pixel electrode 12 in each sub-pixel P. In some examples, the material of the first transparent conductive layer 40 includes a transparent conductive material such as Indium Tin Oxide (ITO) or Indium Zinc Oxide (IZO).

Figure 13:
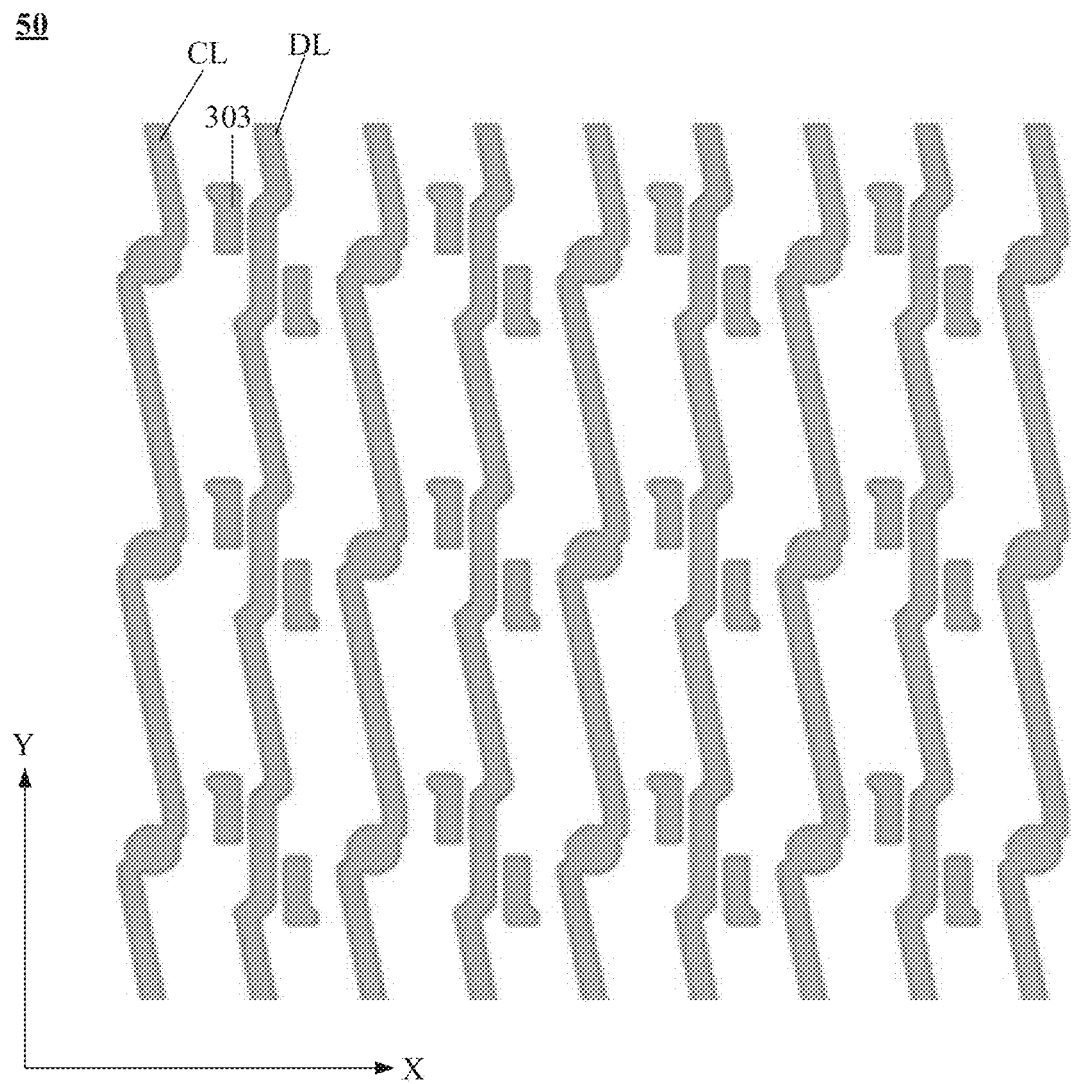
FIG. 13 is a layout of a first metal layer in an array substrate according to an embodiment of the disclosure.
Figure 14:
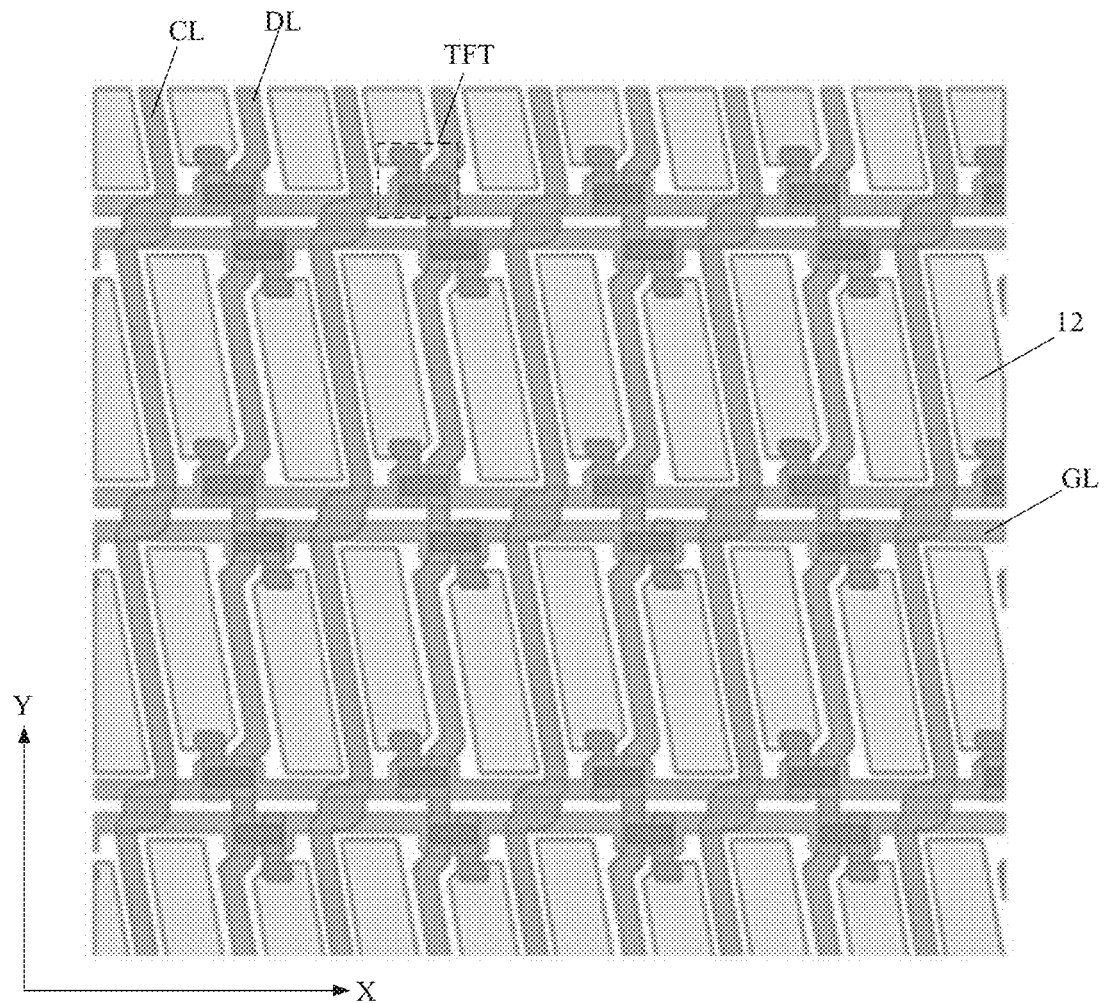
FIG. 14 is a layout of a first metal layer formed on a base substrate on which a first transparent conductive layer is formed.

FIG. 13 is a layout of a first metal layer in the array substrate according to the embodiment of the disclosure; and FIG. 14 is a layout of a first metal layer formed on a base substrate on which a first transparent conductive layer is formed. As shown in FIGS. 13 and 14, the first metal layer 50 includes data lines DL, common electrode lines CL, and source and drain electrodes 303 of the thin film transistors TFT in the sub-pixels P. The source electrode of each thin film transistor TFT and the data line DL coupled thereto are formed as a single piece, the source electrode 303 and the drain electrode 303 of each thin film transistor TFT are coupled to the source region and the drain region of the semiconductor active layer, respectively, and the drain electrode 303 of each thin film transistor TFT is electrically coupled to the pixel electrode 12. In some examples, the first metal layer 50 includes, but is not limited to, a single layer or a multi-layer structure formed of metal such as molybdenum, aluminum, titanium, etc., and for example, the multi-layer structure is a stack of multiple metal layers, such as a three-layer metal stack (Al/Ti/Al) having a titanium layer, an aluminum layer, and a titanium layer.

In some examples, the second interlayer insulating layer 13 is formed on a side of the first metal layer 50 away from the base substrate 10. The second interlayer insulating layer 13 may be a passivation layer (PVX) formed of a material such as silicon oxide, silicon nitride, or silicon oxynitride.

Figure 15:
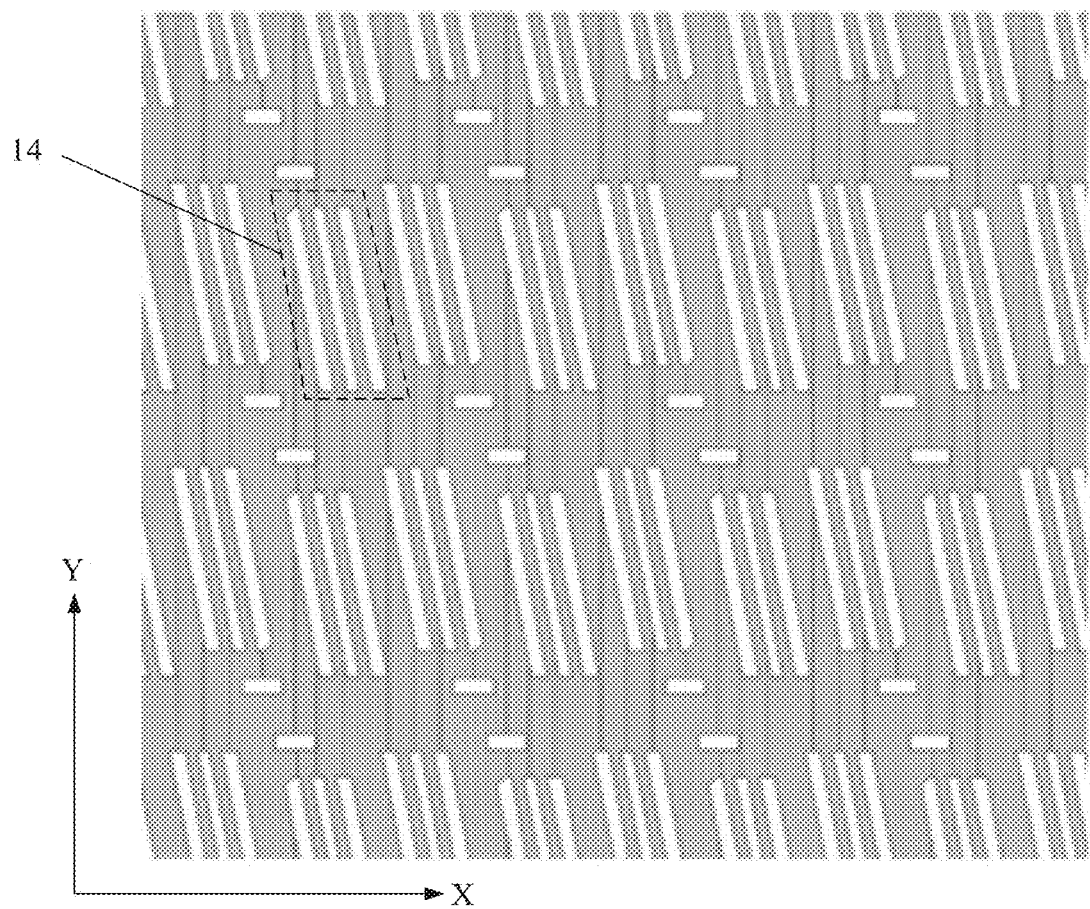
FIG. 15 is a layout of a second transparent conductive layer in the array substrate according to an embodiment of the present disclosure.

FIG. 15 is a layout of a second transparent conductive layer in the array substrate according to the embodiment of the disclosure. As shown in FIGS. 5 and 15, the second transparent conductive layer 60 includes the common electrode 14 in each sub-pixel P, and the second transparent conductive layer 60 is electrically coupled to the common electrode line CL through a via penetrating the second interlayer insulating layer 13. In some examples, the material of the second transparent conductive layer 60 may be the same as the material of the first transparent conductive layer 40. The description of the array substrate in the embodiments of the present disclosure is completed now.

Figure 16:
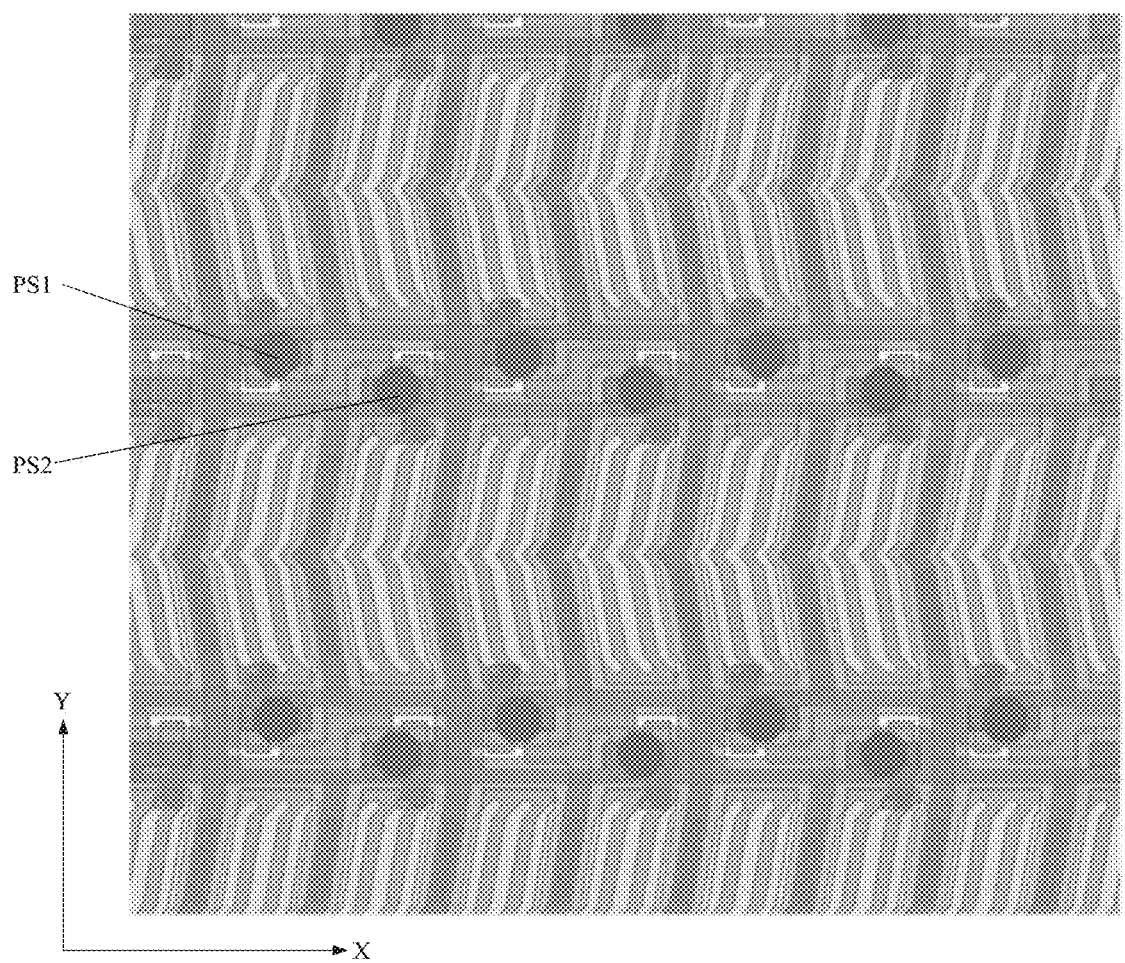
FIG. 16 is a layout of a display panel according to an embodiment of the present disclosure.

FIG. 16 is a layout of a display panel according to an embodiment of the present disclosure. As shown in FIG. 16, the present disclosure also provides a display panel, which includes the array substrate described above and a counter substrate opposite to the array substrate. The counter substrate may be a color filter substrate, and in the embodiment of the present disclosure, the counter substrate is illustrated as the color filter substrate. Certainly, the display panel further includes a liquid crystal layer disposed between the array substrate and the color filter substrate, and a spacer PS for maintaining the cell thickness. The orthographic projection of one spacer PS on the base substrate 10 is located within the orthographic projection of one protrusion of the common electrode line CL on the base substrate 10.

In some examples, referring to FIG. 7 as well, the spacers in the display panel includes a first spacer PS1 and a second spacer PS2, the first spacer PS1 has a larger height than the second spacer PS2, and an area of the orthographic projection of the first spacer PS1 on the base substrate 10 is larger than an area of the orthographic projection of the second spacer PS2 on the base substrate 10. In this case, the first spacer PS1 serves as a main spacer to maintain the cell thickness of the display panel; and the second spacer PS2 serves as an auxiliary spacer to act as a buffer when the external force is applied on the display panel. In the embodiment of the present disclosure, the protrusions 102 are formed on the common electrode line CL, and the spacers are disposed at positions corresponding to the protrusions 102, so that a problem that an aperture ratio of each sub-pixel P is not uniform due to different sizes of the spacers can be effectively avoided.

Further, the first spacer PS1 and the second spacer PS2 in the embodiment of the present disclosure may be formed on the color filter substrate 300, in which case, a certain distance exists between the second spacer PS2 and the array substrate 200. Of course, both the first spacer PS1 and the second spacer PS2 may be formed on the array substrate 200, in which case, a certain distance exists between the second spacer PS2 and the color filter substrate 200.

In some examples, the first spacers PS1 and the second spacers PS2 in the display panel are uniformly arranged, and the ratio of the arrangement density of the first spacers PS1 to the arrangement density of the second spacers PS2 is about 1:30 to 1:70. For example, the arrangement density of the first spacers PS1 is 1/108, the arrangement density of the second spacers PS2 is 52/108, and the ratio of the arrangement density of the first spacers PS1 to the arrangement density of the second spacers PS2 is 1:52. For another example, the arrangement density of the first spacers PS1 is 1/72, the arrangement density of the second spacers PS2 is 34:72, and the ratio of the arrangement density of the first spacers PS1 to the arrangement density of the second spacers PS2 is 1:34. It should be noted that the arrangement density of the first spacers PS1 and the arrangement density of the second spacers PS2 depend on the size of the display panel, and the areas of the orthographic projections of the first spacers PS1 and the second spacers PS2 on the base substrate 10. The display panel in the embodiment of the present disclosure can have a PPI of more than 300 by including the array substrate described above, which is particularly suitable for a projector project.

It will be understood that the above embodiments are merely exemplary embodiments adopted to illustrate the principles of the present invention, and the present invention is not limited thereto. It will be apparent to those skilled in the art that various modifications and improvements can be made without departing from the spirit and scope of the present disclosure, and such modifications and improvements are also considered to be within the scope of the invention.

What is claimed is:

1. A display substrate, comprising: a base substrate; and a plurality of gate lines, a plurality of data lines and a plurality of sub-pixels on the base substrate, wherein the plurality of sub-pixels form a plurality of first pixel groups arranged side by side along a first direction and a plurality of second pixel groups arranged side by side along a second direction;

each of the plurality of first pixel groups comprises sub-pixels arranged side by side in the second direction; each of the plurality of second pixel groups comprises sub-pixels arranged side by side in the first direction;

gate lines are provided on each of two sides of each second pixel group in the second direction;

one of two adjacent sub-pixels in the second pixel group is coupled to a gate line located on one of two sides of the second pixel group in the second direction, and the other of the two adjacent sub-pixels is coupled to a gate line located on the other of the two sides of the second pixel group in the second direction;

in every two adjacent first pixel groups, the sub-pixels are coupled to a same data line, and the sub-pixels coupled to the same data line are coupled to different gate lines, wherein any two adjacent first pixel groups define a first region therebetween, any two adjacent second pixel groups define a second region therebetween, and the display substrate further comprises a common electrode line in at least a portion of the first regions, and the common electrode line and the data line are located in different first regions; and the common electrode line comprises a plurality of common electrode line segments and protrusions each coupled between two common electrode line segments, a width of at least one of the protrusions in any direction is larger than a width of the common electrode line segment in the first direction; and the protrusions are located in the second region, wherein the data line comprises a plurality of data line segments, and a connection line segment connecting two adjacent data line segments; the connection line segment comprises a first sub-connection line segment and a second sub-connection line segment, and the first sub-connection line segment is coupled to the data line segment via the second sub-connection line segment; the first sub-connection line segment is in the second region; an included angle between an extending direction of the data line segment and the second direction is 5 to 10 degrees; and an included angle formed by the second sub-connection line segment and the data line segment is 100 to 130 degrees.

2. The display substrate according to claim 1, wherein the sub-pixel comprises a thin film transistor and a pixel electrode provided therein; a gate electrode of the thin film transistor is coupled to the gate line, a source electrode of the thin film transistor is coupled to the data line, and a drain electrode of the thin film transistor is coupled to the pixel electrode;

the pixel electrodes in a same second pixel group form a pixel electrode group, and the thin film transistors in any two adjacent sub-pixels in a same second pixel group are respectively located on two opposite sides of the pixel electrode group in the second direction; and wherein one of any two thin film transistors coupled to a same data line and located in the sub-pixels in two adjacent first pixel groups is coupled to the data line at a first node, the other of the two thin film transistors is coupled to the data line at a second node, and the two thin film transistors are in central symmetry with a midpoint between the first node and the second node as a symmetry center.

3. The display substrate according to claim 2, wherein the source electrode of the thin film transistor is coupled to the first sub-connection line segment.

4. The display substrate according to claim 3, further comprising a common electrode; one of the pixel electrode and the common electrode is a slit electrode, and the other is a plate electrode; and an extending direction of slits of the slit electrode is the same as the extending direction of the data line segment.

5. The display substrate according to claim 3, wherein an extending direction of the common electrode line segment is the same as the extending direction of the data line segment.

6. The display substrate according to claim 2, wherein the display substrate comprises a first metal layer on the base substrate; and the first metal layer comprises the data line, the common electrode line, and the source electrode and the drain electrode of the thin film transistor.

7. The display substrate according to claim 2, wherein the display substrate comprises a second metal layer on the base substrate; and the second metal layer comprises the gate line and the gate electrode of the thin film transistor.

8. The display substrate according to claim 2, wherein the display substrate comprises a second metal layer, a first interlayer insulating layer, a semiconductor layer, a first transparent conductive layer, a first metal layer, a second interlayer insulating layer, and a second transparent conductive layer arranged in sequence along a direction away from the base substrate;
the first metal layer comprises the data line, the common electrode line, and the source electrode and the drain electrode of the thin film transistor;
the second metal layer comprises the gate line and the gate electrode of the thin film transistor;
the first transparent conductive layer comprises the pixel electrode; and
the second transparent conductive layer comprises a common electrode.

9. The display substrate according to claim 2, wherein the data line and the common electrode line are alternately arranged in the first direction.

10. The display substrate according to claim 2, wherein an orthographic projection of the gate electrode of the thin film transistor on the base substrate covers an orthographic projection of a semiconductor active layer of the thin film transistor on the base substrate,
the orthographic projection of the gate electrode on the base substrate comprises a first side and a second side oppositely arranged along the first direction, and a third side and a fourth side oppositely arranged along the second direction; the orthographic projection of the semiconductor active layer on the base substrate comprises a fifth side and a sixth side oppositely arranged along the first direction, and a seventh side and an eighth side oppositely arranged along the second direction;

the fourth side is in contact with an orthographic projection of the gate line on the base substrate; and
the first side corresponds to the fifth side, and a distance between the first side and the fifth side is S1; the second side corresponds to the sixth side, and a distance between the second side and the sixth side is S2; the third side corresponds to the seventh side, and a distance between the third side and the seventh side is S3; and at least one of S1, S2, and S3 is less than 3 μm.

11. The display substrate according to claim 1, wherein a width of any one of the protrusions in any direction is greater than the width of the common electrode line segment in the first direction; and the protrusions are the same in size.

12. A display panel, comprising the display substrate of claim 1.

13. The display panel according to claim 12, further comprising a counter substrate opposite to the display substrate, and a spacer between the display substrate and the counter substrate, wherein an orthographic projection of the spacer on the base substrate is within an orthographic projection of the protrusion on the base substrate.

14. The display panel according to claim 13, wherein the spacer comprises first spacers and second spacers; a height of the first spacer is greater than a height of the second spacer; and two ends of the first spacer are respectively abutted against the display substrate and the counter substrate.

15. The display panel according to claim 14, wherein both the first spacers and the second spacers are uniformly arranged in the display panel, and a ratio of an arrangement density of the first spacers to an arrangement density of the second spacers is 1:30 to 1:70.

16. The display substrate according to claim 2, wherein the sub-pixels in which the two thin film transistors are respectively located are in central symmetry with respect to the symmetry center.

17. The display substrate according to claim 16, wherein the pixel electrodes in the sub-pixels in which the two thin film transistors are respectively located are in central symmetry with respect to the symmetry center.

18. The display substrate according to claim 4, wherein the common electrode is the slit electrode including slits, the pixel electrode in each sub-pixel is the plate electrode, and
in each sub-pixel, an orthographic projection of the pixel electrode on the base substrate overlaps with orthographic projections of respective ones of slits of the common electrode on the base substrate.

19. The display substrate according to claim 18, wherein respective ones of the slits of the sub-pixels in which the two thin film transistors are respectively located are in central symmetry with respect to the symmetry center.

20. A display substrate, comprising: a base substrate; and a plurality of gate lines, a plurality of data lines and a plurality of sub-pixels on the base substrate, wherein
the plurality of sub-pixels form a plurality of first pixel groups arranged side by side along a first direction and a plurality of second pixel groups arranged side by side along a second direction;
each of the plurality of first pixel groups comprises sub-pixels arranged side by side in the second direction; each of the plurality of second pixel groups comprises sub-pixels arranged side by side in the first direction;
one of two adjacent sub-pixels in the second pixel group is coupled to a gate line located on one of two sides of the second pixel group in the second direction, and the other of the two adjacent sub-pixels is coupled to a gate line located on the other of the two sides of the second pixel group in the second direction;

in every two adjacent first pixel groups, the sub-pixels are coupled to a same data line, and the sub-pixels coupled to the same data line are coupled to different gate lines, wherein any two adjacent first pixel groups define a first region therebetween, any two adjacent second pixel groups define a second region therebetween, each second region is provided with two gate lines, the display substrate further comprises a common electrode line in at least a portion of the first regions, and the common electrode line and the data line are located in different first regions; and the common electrode line comprises a plurality of common electrode line segments and protrusions each coupled between two common electrode line segments, a width of at least one of the protrusions in any direction is larger than a width of the common electrode line segment in the first direction; and the protrusions are located in the second region, and in the second region, an orthographic projection of each of the protrusions overlaps with orthographic projections of the two gate lines on the base substrate.

* * * * *